(12) United States Patent
Cho et al.

(10) Patent No.: US 6,781,732 B2
(45) Date of Patent: Aug. 24, 2004

(54) ELECTROMAGNETICALLY ACTUATED MICROMIRROR ACTUATOR AND FABRICATION METHOD THEREOF

(75) Inventors: Il-Joo Cho, Seoul (KR); Kwang-Seok Yun, Seoul (KR); Euisik Yoon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 66 days.

(21) Appl. No.: 10/342,350

(22) Filed: Jan. 15, 2003

(65) Prior Publication Data

US 2004/0012460 A1 Jan. 22, 2004

(30) Foreign Application Priority Data

Jul. 16, 2002 (KR) .................................... 10-2002-41515

(51) Int. Cl.[7] .............................................. G02B 26/08
(52) U.S. Cl. ...................................... 359/224; 359/199
(58) Field of Search ................................ 359/223, 224, 359/226, 199, 212, 213; 385/18; 248/575, 576, 592, 593

(56) References Cited

U.S. PATENT DOCUMENTS

| | | | |
|---|---|---|---|
| 5,526,951 A | | 6/1996 | Bailey et al. |
| 5,579,148 A | * | 11/1996 | Nishikawa et al. ......... 359/214 |
| 6,000,280 A | * | 12/1999 | Miller et al. .................. 73/105 |
| 6,201,631 B1 | | 3/2001 | Greywall |

OTHER PUBLICATIONS

Cho, Il–Joo et al., "A Low–Voltage Two–Axis Electromagnetically Actuated Micromirror with Bulk Silicon Mirror Plates and Torsion Bars," Technical Digest, MEMS 2002, The Fifteenth IEEE International Conference, Las Vegas, Jan. 20–24, 2002, pp. 540–543.

* cited by examiner

Primary Examiner—Euncha P. Cherry
(74) Attorney, Agent, or Firm—Oliff & Berridge, PLC

(57) ABSTRACT

Disclosed is a micromirror actuator having a two-axis freedom and actuated by an electromagnetic force and fabrication method thereof. The micromirror actuator includes a substrate, a frame configured to be connected with the substrate, a micromirror configured to be connected with the frame, first and second torsion bars connecting the substrate with the frame, third and fourth torsion bars connecting the frame with the micromirror, four interdigitated cantilevers configured to be connected to the substrate, four connecting bars connecting the four interdigitated cantilevers with the frame, interconnection lines formed on the four interdigitated cantilevers and the micromirror, and first and second magnets installed outside the substrate. Since the micromirror actuator of the present invention can be actuated around two axes by electromagnetic force generated by electromagnetic field applied from outside, it is possible to obtain large force and large rotational angle. In addition, the micromirror actuator has a mechanically robust structure endurable against external impact, and is operable at a low voltage of 5V or loss. Further, it is possible to obtain a flat mirror surface sine the upper silicon layer of the SOI substrate is used as the mirror surface.

11 Claims, 11 Drawing Sheets

(1)

(2)

(3)

(1)

(2)

(1)

(2)

ELECTROMAGNETICALLY ACTUATED MICROMIRROR ACTUATOR AND FABRICATION METHOD THEREOF

BACKGROUND OF THE INVENTION

1. Field of the Invention

The present invention relates to an electromagnetically actuated micromirror actuator and fabrication method thereof, and more particularly, to an electromagnetically actuated micromirror actuator having a two-axis freedom and actuated by the electromagnetic force and fabrication method thereof.

2. Description of the Related Art

Micromirror functions to change light path depending on the rotational degree of the mirror. This micromirror is widely used in optical switches, optical scanners, display and the like.

The conventional micromirror uses an actuator using electrostatic force. The electrostatic force is weak and therefore it is requested that the force constant of the torsion bars that are a portion to support the micromirror be small so as to rotate the micromirror at a desired angle. In this case, the torsion bars have to be thin, which make the micromirror brittle to an external impact, so that the operation of the micromirror is unreliable. In addition, in order to obtain a desired rotational angle, a large voltage above a few hundred volts is necessary. As one example of such application, there is disclosed a fabrication method of an optical micromirror using electrostatic force in U.S. Pat. No. 6,201,631.

SUMMARY OF THE INVENTION

Accordingly, the present invention has been devised to solve the above problems, and it is an object of the present invention to provide a micromirror actuator and fabrication method thereof which has a mechanically robust structure endurable against an external impact, enables a reliable operation having a large rotational angle, and being operable at a relatively low voltage.

To achieve the objects and other advantages, there is provided a micromirror actuator. The micromirror actuator includes: a substrate having a first penetration hole penetrating the substrate; a frame having a second penetration hole penetrating the frame, disposed inside the first penetration hole of the substrate, and connected with the substrate by first and second torsion bars formed to be bilateral symmetric around the frame; a micromirror disposed inside the second hole of the frame and connected with the frame by third and fourth torsion bars formed to be back and forth symmetric around the micromirror; first and second interdigitated cantilevers located between the substrate and the frame and protrudely formed from an inner wall of the first penetration hole to inside of the second penetration hole to be bilateral symmetric; third and fourth interdigitated cantilevers located between the substrate and the frame, protrudely formed from an inner wall of the first penetration hole to inside of the second penetration hole to be back and forth symmetric to the first and second interdigitated cantilevers; first and second interconnection lines respectively formed on the first and second interdigitated cantilevers and connected with each other, third and fourth interconnection lines respectively formed on the third and fourth interconnection lines to be connected with each other and having a current flow direction opposite to a current flow direction flowing through the first and second interconnection lines, and fifth and sixth interconnection lines that are bilateral symmetric to an imaginary line connecting the third torsion bar and the fourth torsion bar and respectively formed on the micromirror such that currents having opposite directions flow; first to fourth connecting bars connecting the first to fourth interdigitated cantilevers with the frame respectively; and first and second magnets respectively installed outside the substrate to be bilateral symmetric to the substrate and having different polarities from each other.

In accordance with another embodiment of the present invention, there is provided a method for fabricating the micromirror actuator. The method includes the steps of: (a) preparing an SOI substrate including an upper silicon layer, an oxide layer and a lower silicon layer; (b) etching the upper silicon layer to form the frame, the first to fourth torsion bars, the first to fourth interdigitated cantilevers, and the first to fourth connecting bars; (c) plating an interconnection line on the first to fourth interdigitated cantilevers and the micromirror; and (d) etching the lower silicon layer and removing the oxide layer such that the frame, the micromirror, the first to fourth torsion bars, the first to fourth interdigitated cantilevers, and the first to fourth connecting bars maintain only a predetermined thickness.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Now, preferred embodiments of the present invention will be described in detail with reference to the annexed drawings.

Figure 1A:
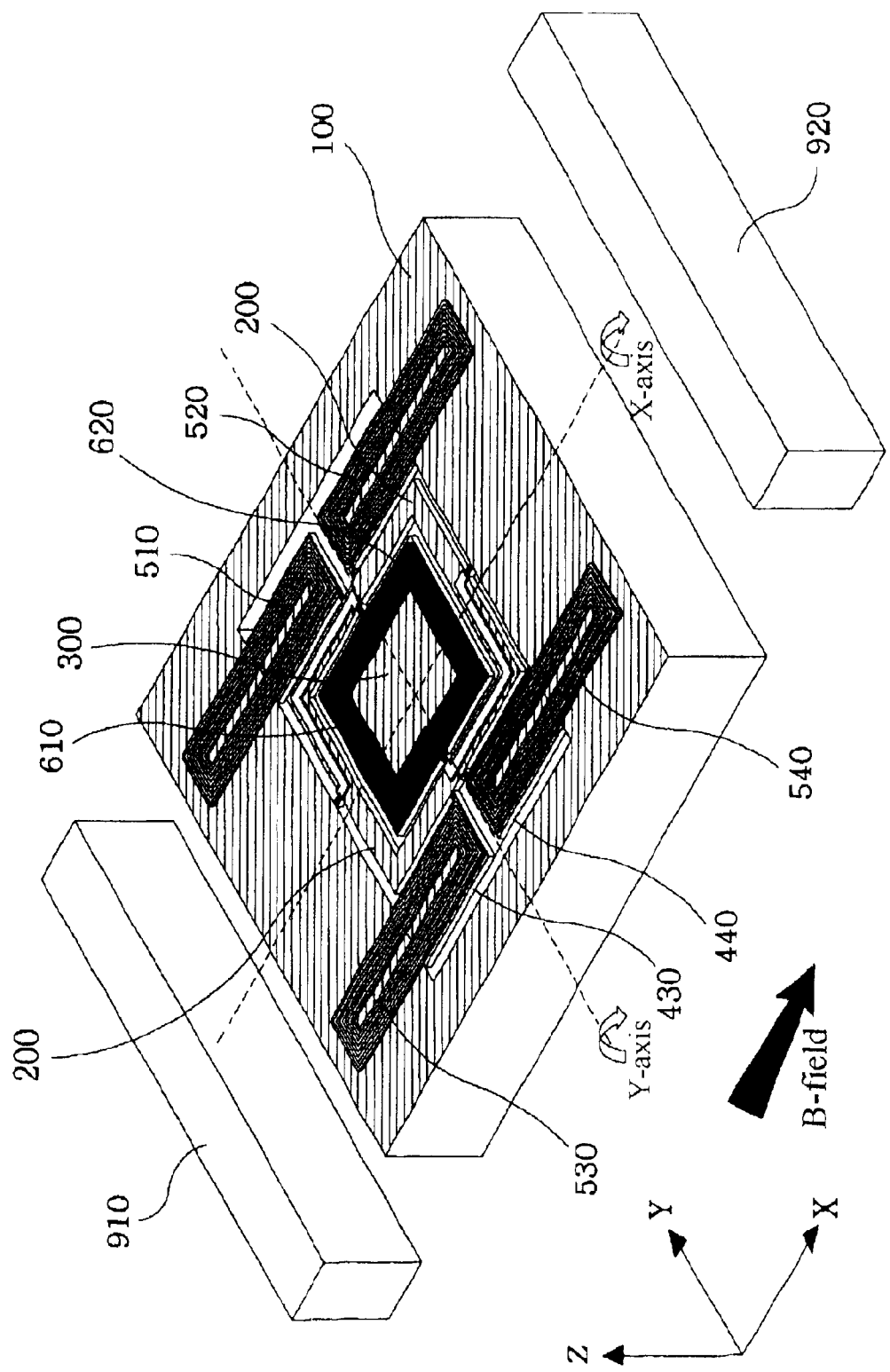
FIG. 1A is a perspective view for illustrating a micromirror actuator according to an embodiment of the present invention.
Figure 1B:
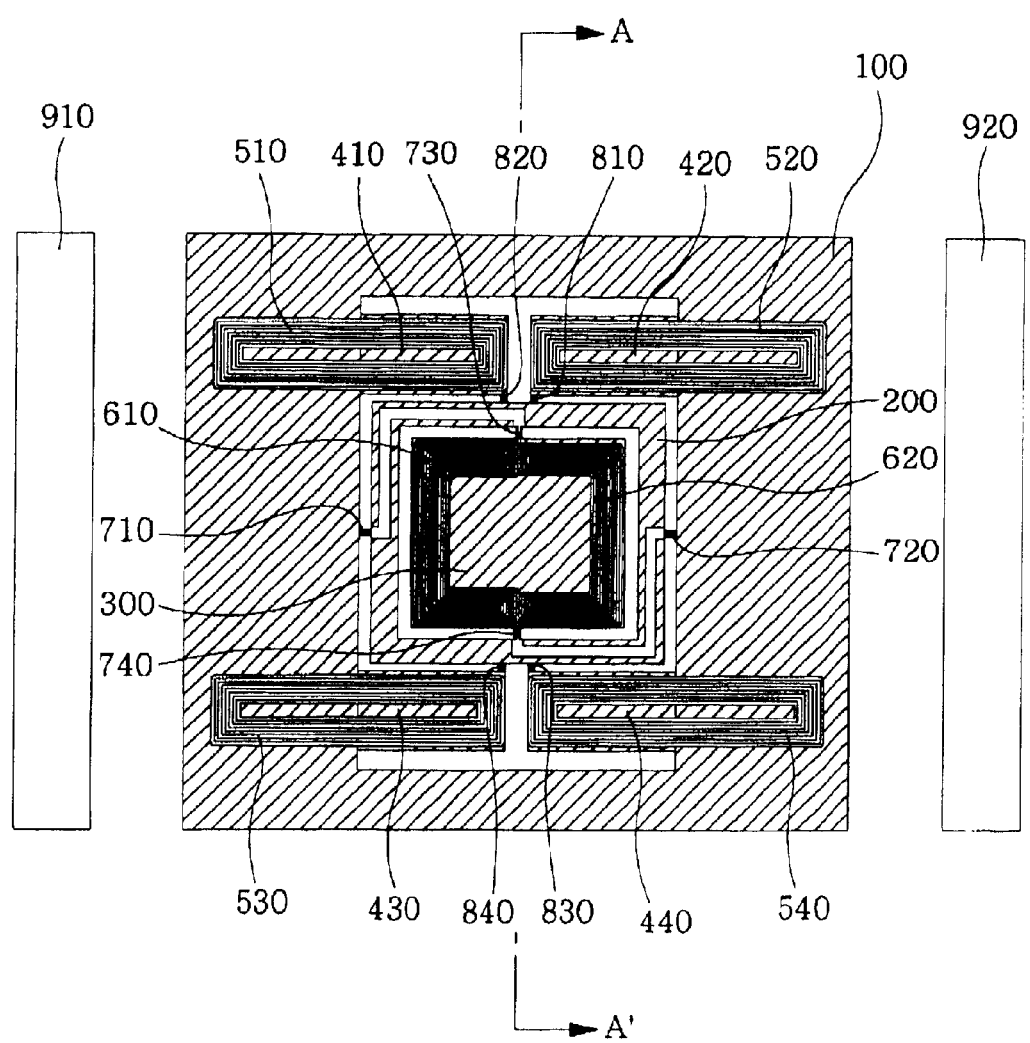
FIG. 1B is a plan view of the micromirror actuator of FIG. 1A.

FIG. 1A is a perspective view for illustrating a micromirror actuator according to an embodiment of the present invention, FIG. 1B is a plan view of the micromirror actuator of FIG. 1A, and FIGS. 2A to 2I are schematic views for illustrating a fabrication method of the micromirror actuator according to FIGS. 1A and 1B, and are sectional views taken along the line A-A' of FIG. 1B.

Referring to FIGS. 1A and 1B, a micromirror actuator according to the present invention includes a substrate 100, a frame 200 configured to be connected with the substrate 100, a micromirror 300 configured to be connected with the frame 200, first and second torsion bars 710 and 720 connecting the substrate 100 with the frame 200, third and fourth torsion bars 730 and 740 connecting the frame 200 with the micromirror 300, four interdigitated cantilevers 410, 420, 430, 440 configured to be connected to the substrate 100, four connecting bars 810, 820, 830, 840 connecting the four interdigitated cantilevers 410, 420, 430, 440 with the frame 200, interconnection lines 510, 520, 530, 540, 610, 620 formed on the four interdigitated cantilevers 410, 420, 430, 440 and the micromirror 300, and first and second magnets 910, 920. At this time, the substrate 100, the frame 200, the micromirror 300, the four interdigitated cantilevers 410, 420, 430, 440, the torsion bars 710, 720, 730, 740, and the connecting bars 810, 820, 830, 840 are termed only by the use of them, and they are made of a single bulk silicon. It is desirable to further deposit a metal film on the micromirror 300.

A hole is formed in the substrate 100 to penetrate the upper surface and the lower surface thereof. The frame 200 also has a penetration hole to penetrate the upper portion and the lower portion thereof, and is connected with the substrate 100 by the first and second torsion bars 710 and 720 disposed to be bilateral symmetric to the left and right directions inside the hole of the substrate 100. The micromirror 300 is installed within the penetration hole of the frame 200 by third and fourth torsion bars 730 and 740 arranged to be back and forth symmetric around the micromirror 300. The terms "bilateral" and "back and forth" used in the present embodiment represent the four directions, and are to describe the symmetry and the positional relationship. Accordingly, the frame 200 is within the substrate 100, the micromirror 300 is within the frame 200, the substrate 100 and the frame 200 are connected by the first and second torsion bars 710, 720, the frame 200 and the micromirror 300 are connected by the first and fourth torsion bars 730 and 740, and a first imaginary line connecting the first torsion bar 710 and the second torsion bar 720 and a second imaginary line connecting the third torsion bar 730 and the fourth torsion bar 740 are perpendicular to each other.

The four interdigitated cantilevers 410, 420, 430, 440 are protruded from an inner wall of the hole of the substrate toward the inside of the hole to be located between the substrate 100 and the frame 200. The first interdigitated cantilever 410 and the second interdigitated cantilever 420 are bilateral symmetry, and the third interdigitated cantilever 430 and the fourth interdigitated cantilever 440 are back and forth symmetry to the first and second interdigitated cantilevers 410 and 420 with respect to the frame 200.

The first and second connecting bars 810 and 820 connect the first and second interdigitated cantilevers 410 and 420 with the frame 200 respectively, and the third and fourth connecting bars 830 and 840 connect the third and fourth interdigitated cantilevers 430 and 440 with the frame 200 respectively. Accordingly, the frame 200 is connected with the substrate 100, the micromirror 300 and the interdigitated cantilevers 410, 420, 430, 440 respectively.

The interconnection lines 510, 520, 530, 540 are respectively formed on the first to fourth interdigitated cantilevers 410, 420, 430, 440 and the micromirror 300. At this time, the first and second interconnection lines 510 and 520 formed on the third and fourth interdigitated cantilevers 430 and 440 are connected with each other, and the third and fourth interconnection lines 530 and 540 formed on the third and fourth interdigitated cantilevers 430 and 440 are connected with each other such that a current direction flowing through the first and second interconnection lines 510 and 520 is opposite to a current direction flowing through the third and fourth interconnection lines 530 and 540. Fifth and sixth interconnection lines are formed on the micromirror 300 such that currents having opposite directions flow therethrough. The fifth and sixth interconnection lines are formed to be bilateral symmetry with respect to the imaginary line connecting the third torsion bar 730 and the fourth torsion bar 740. The first and second magnets have opposite polarities, and are respectively installed outside the substrate 100 to be bilateral symmetry. Accordingly, the four interdigitated cantilevers 410, 420, 430, 440 and the micromirror 300 are parallel with the magnetic field.

Next, operation of the micromirror actuator according to the present invention is described.

As currents are respectively applied to the first to fourth interconnection lines 510, 520, 530, 540, the electromagnetic force by the current flowing through the first and second interconnection lines 510 and 520 and the electromagnetic force by the current flowing through the third and fourth interconnection lines 530 and 540 are respectively generated in opposite directions, so that the micromirror 300 is rotated around the first and second torsion bars 710 and 720.

If currents are respectively applied to the fifth and sixth interconnection lines, the electromagnetic force by the current flowing through the fifth interconnection line 610 and the electromagnetic force by the current flowing through the sixth interconnection line 620 are respectively generated in opposite directions, so that the micromirror 300 is rotated around the first and second torsion bars 710 and 720.

Hereinafter, a fabrication method of the aforementioned micromirror actuator will be described with reference to FIGS. 2A to 2I.

A method for fabricating a micromirror actuator includes the steps of: preparing an SOI substrate including an upper silicon layer, an oxide layer and a lower silicon layer; etching the upper silicon layer to form a frame, first to fourth torsion bars, first to fourth interdigitated cantilevers, and first to fourth connecting bars (hereinafter referred to as silicon structure); plating an interconnection line on the first to fourth interdigitated cantilevers and the micromirror; and etching the lower silicon layer and removing the oxide layer such that the silicon structure maintains only a predetermined thickness.

Next, the step of etching the upper silicon layer to form the silicon structure will be described with reference to FIGS. 2A and 2B.

Figure 2A:
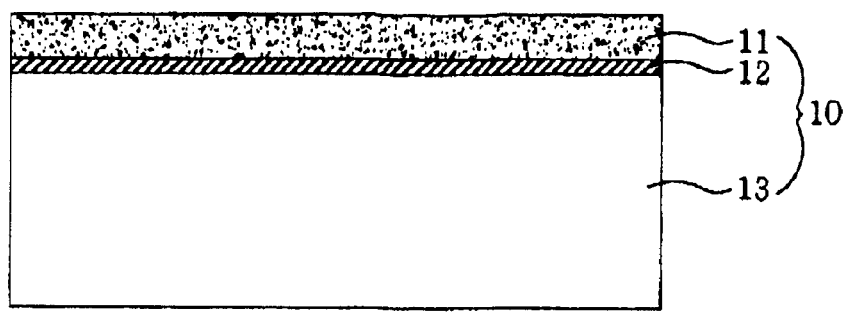
FIGS. 2A to 2I are schematic views for illustrating a fabrication method of the micromirror actuator according to FIGS. 1A and 1B.
Figure 2A:
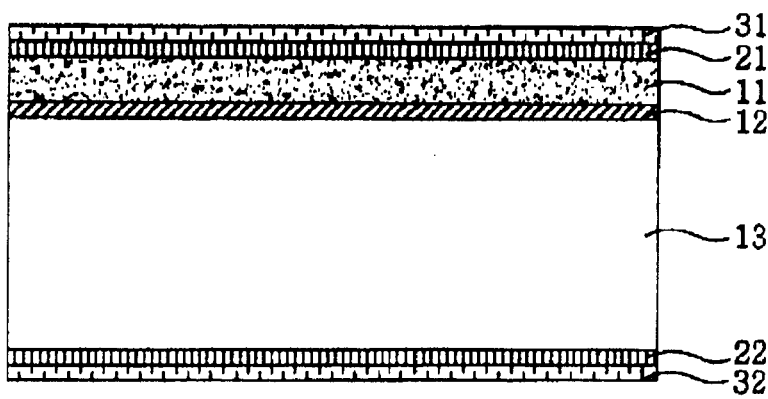
Figure 2A:
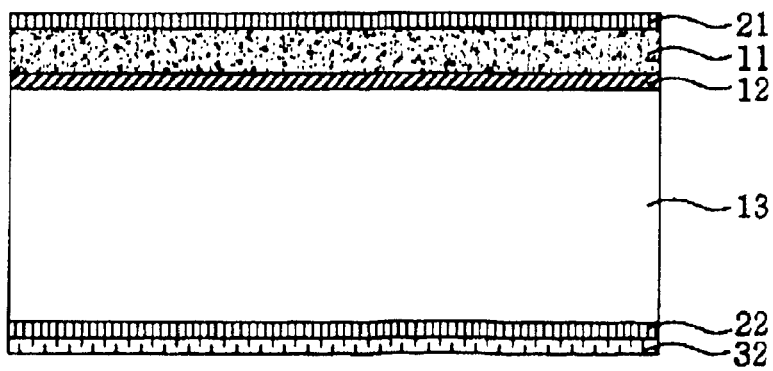

First, referring to FIG. 2A, surfaces of the SOI substrate 10 are oxidized to form an upper silicon oxide film 21 on the upper silicon layer 11 and a lower silicon oxide film 22 beneath the lower silicon layer respectively. A lower silicon nitride film 32 is formed beneath the lower silicon oxide film 22 ((2) of FIG. 2A). The silicon oxide films 21, 22 are used for electrical insulation and as a mask material for the etch of the upper silicon layer 11 in a process to be described later. The lower silicon nitride film 32 is used as a mask in a process for etching the lower silicon layer 13 of the SOI substrate 10. At this time, a silicon nitride film 31 is also formed on the upper silicon oxide film 21. Accordingly, the silicon nitride film 31 formed on the upper silicon oxide film 21 is removed by a dry etch to expose the upper silicon oxide film 21 ((3) of FIG. 2A).

Figure 2B:
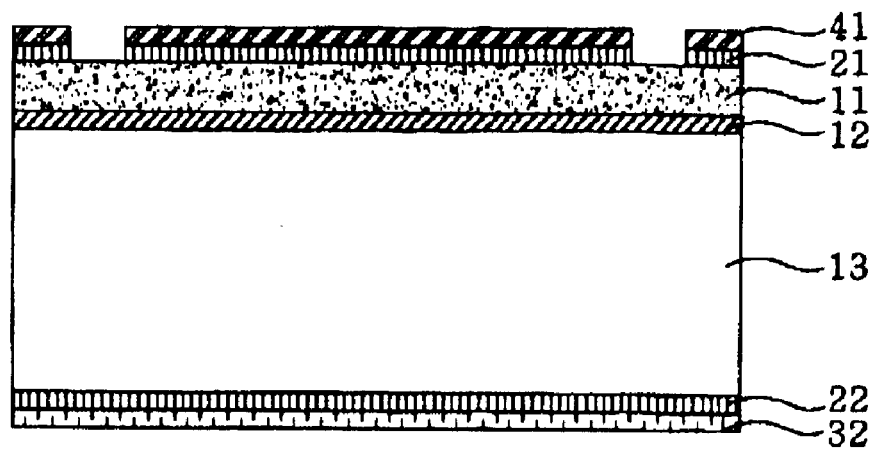
Figure 2B:
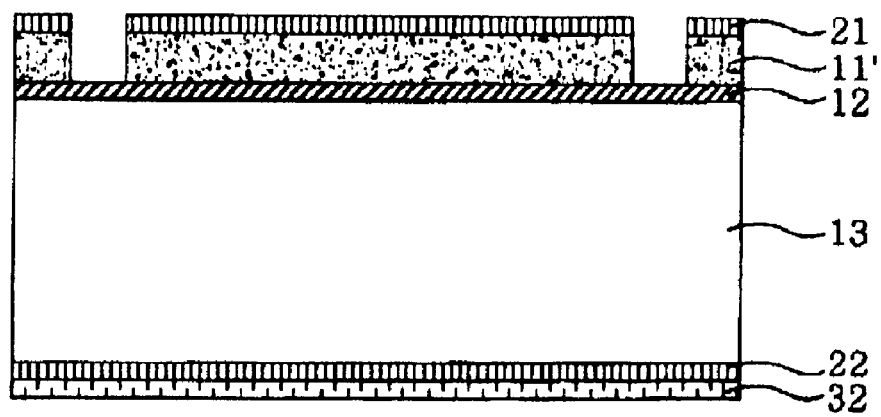

Referring to FIG. 2B, a photoresist film is coated on the exposed upper silicon oxide film 21 and is patterned and developed by a photolithography process so as to leave a region where the silicon structure is being formed. By the photolithography process, a photoresist mask 41 is formed. Afterwards, the exposed upper silicon oxide film 21 is etched by a BOE solution under the existence of the photoresist mask 41 to form a silicon oxide film mask for the etch of the upper silicon layer 11 ((1) of FIG. 2B).

Thereafter, a predetermined region of the upper silicon layer 11 which is exposed by the etch of the exposed silicon oxide film 21 is dry-etched to form the silicon structure 11' ((2) of FIG. 2B).

Next, there is described the step of plating an interconnection line at a predetermined region (micromirror, interdigitated cantilever or the like) on the fabricated silicon structure with reference to FIGS. 2C to 2G.

Figure 2C:
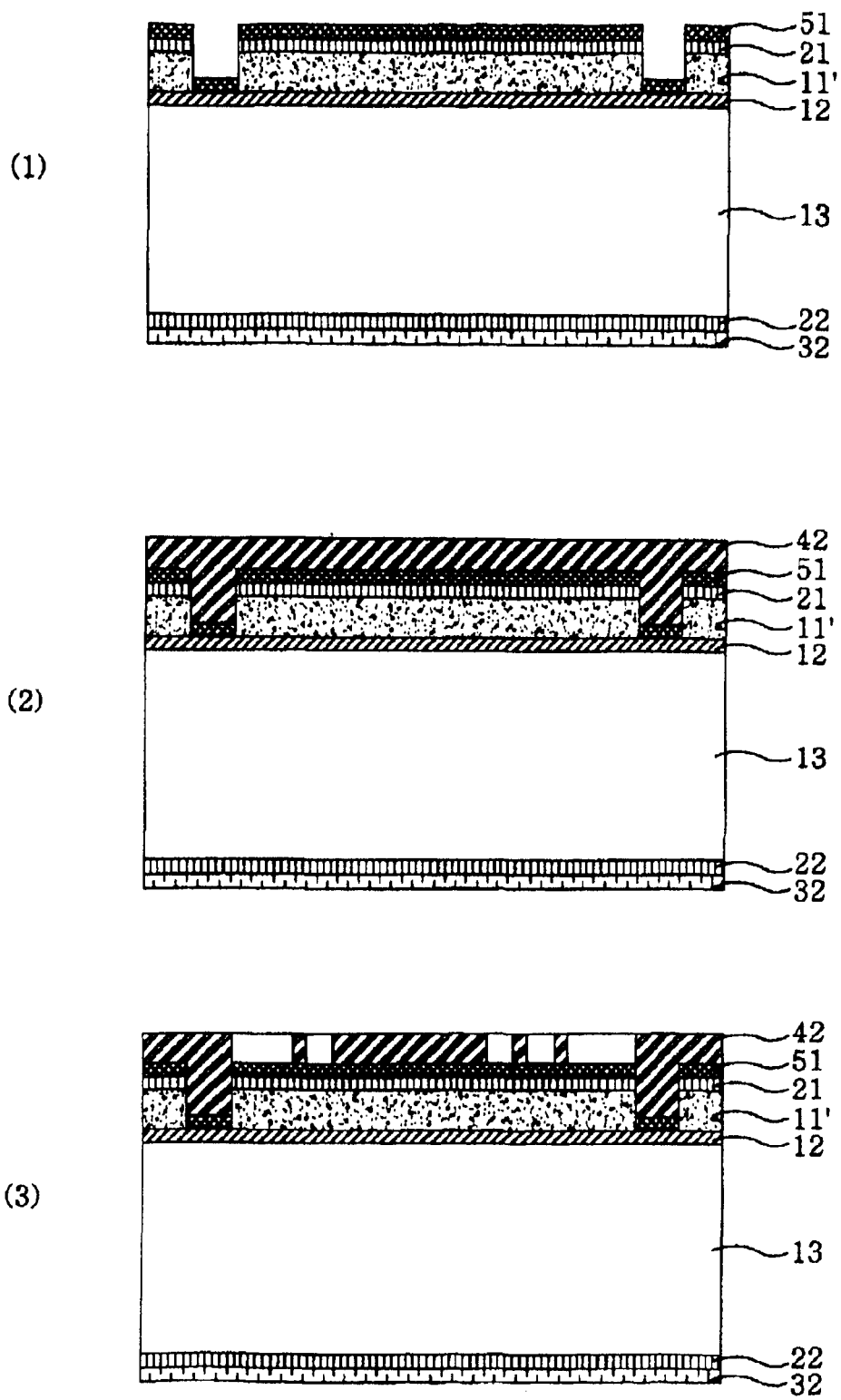

First, referring to FIG. 2C, a lower metal film 51 is deposited on the resultant substrate 11' obtained by etching the upper silicon layer ((1) of FIG. 2C). Here, the lower metal film 51 is a base layer for the electrolytic plating. A photoresist film 42 is coated on the lower metal film 51 ((2) of FIG. 2C). At this time, the photoresist film 42 has to have a thickness greater than the metal layer to be plated since the photoresist film 42 is used as a mold for the electrolytic plating. After the coating of the photoresist film 42, a region of the photoresist film 42 intended to form a lower metal interconnection line is patterned by using a photolithography process to form a lower plating mold ((3) of FIG. 2C).

Figure 2D:
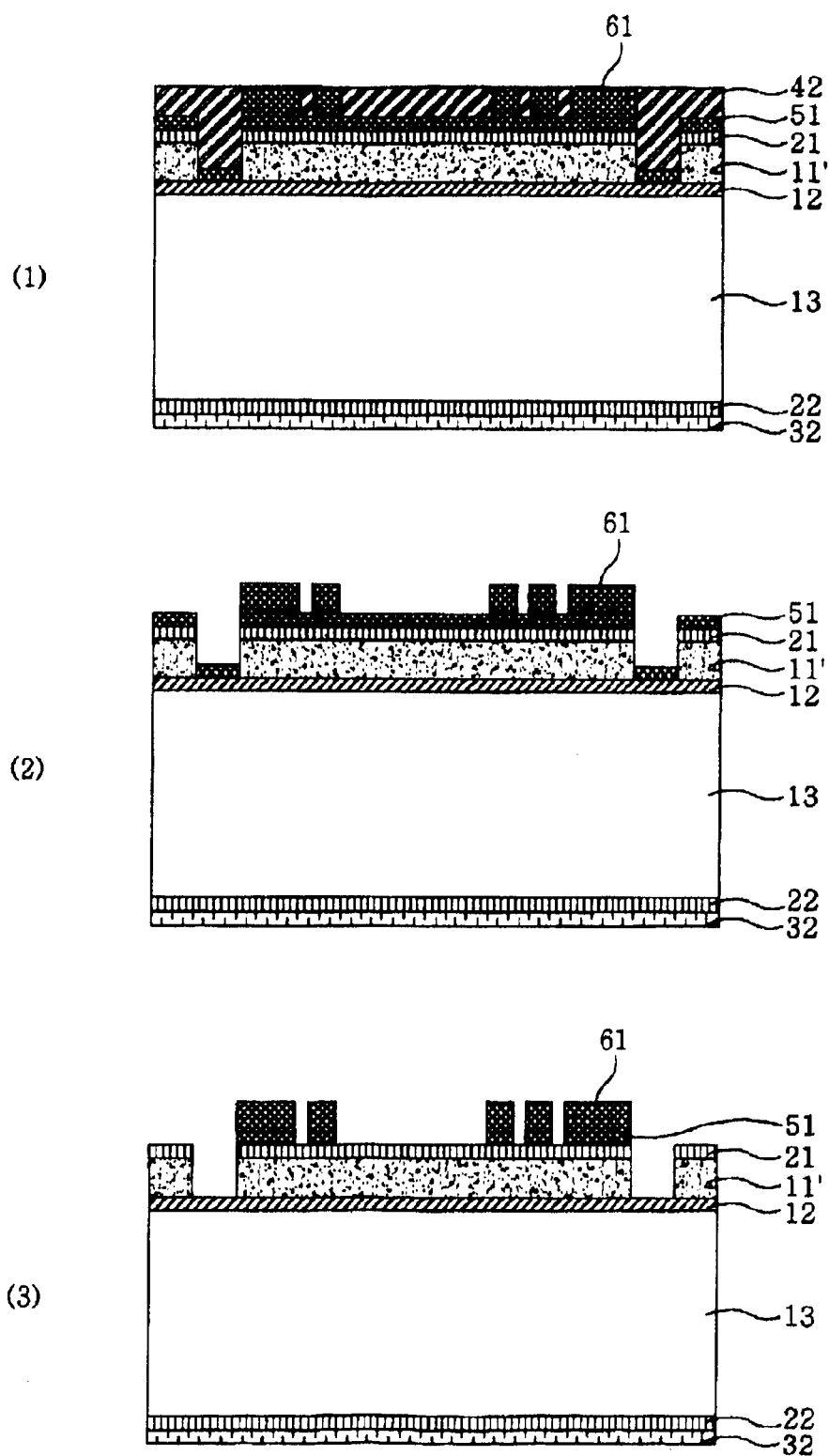

Next, referring to FIG. 2D, a lower metal layer 61 is formed on a predetermined region on the exposed lower metal film 51 by an electrolytic plating in which the patterned photoresist film 42 is used as the lower plating mold. As a result of the above process, a lower metal interconnection line including the lower metal film 51 and the lower metal layer 61 is formed ((1) of FIG. 2D). The photoresist film 42 used as the mold is removed ((2) of FIG. 2D), and a portion of the lower metal film 51 where the lower metal film 61 is not formed thereon is also removed by a wet etch ((3) of FIG. 2D).

In the forming step of the metal interconnection line, the metal interconnection line is, as shown in FIG. 1B, wound in a coil type by several turns. To this end, in order to make a current path, a bridge type interconnection line enabling to connect a pad inside the interconnection line with a pad outside the interconnection line over the interconnection line. Below this interconnection line, another interconnection line proceeds. So, there is a need of insulation between the interconnection lines.

Figure 2E:
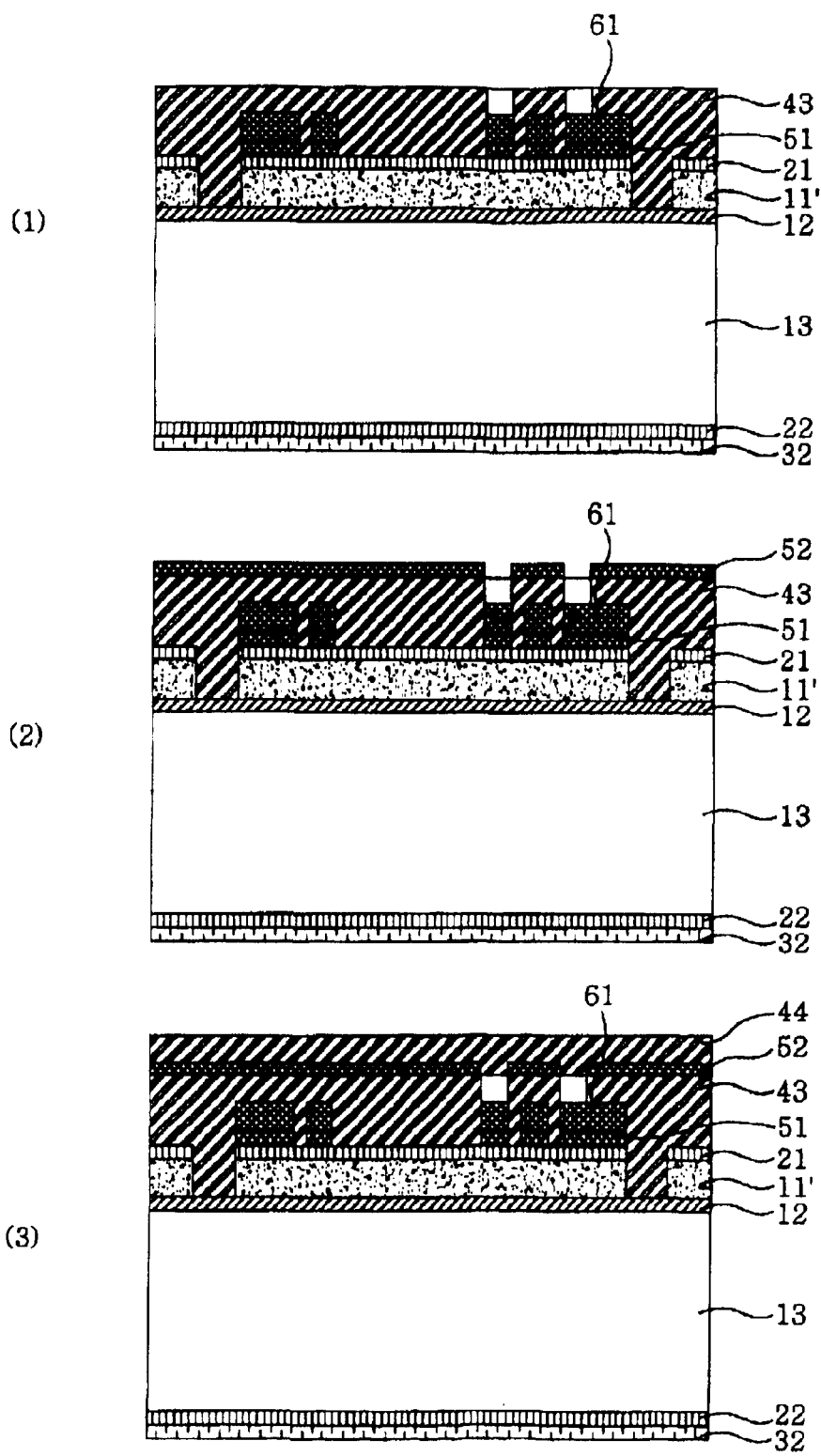

In order to form such a bridge, first referring to FIG. 2E, a photoresist film 43 is coated on the resultant structure resulted from the step of (3) of FIG. 2D, and is patterned to leave a region intended to be the post ((1) of FIG. 2E). After that, the photoresist film 43 is patterned and then an upper metal film 52 is deposited ((2) of FIG. 2E). Subsequently, a photoresist film 44 is coated on the resultant structure. Here, the photoresist film 44 is used as a mold for the electrolytic plating of the bridge ((3) of FIG. 2E).

Figure 2F:
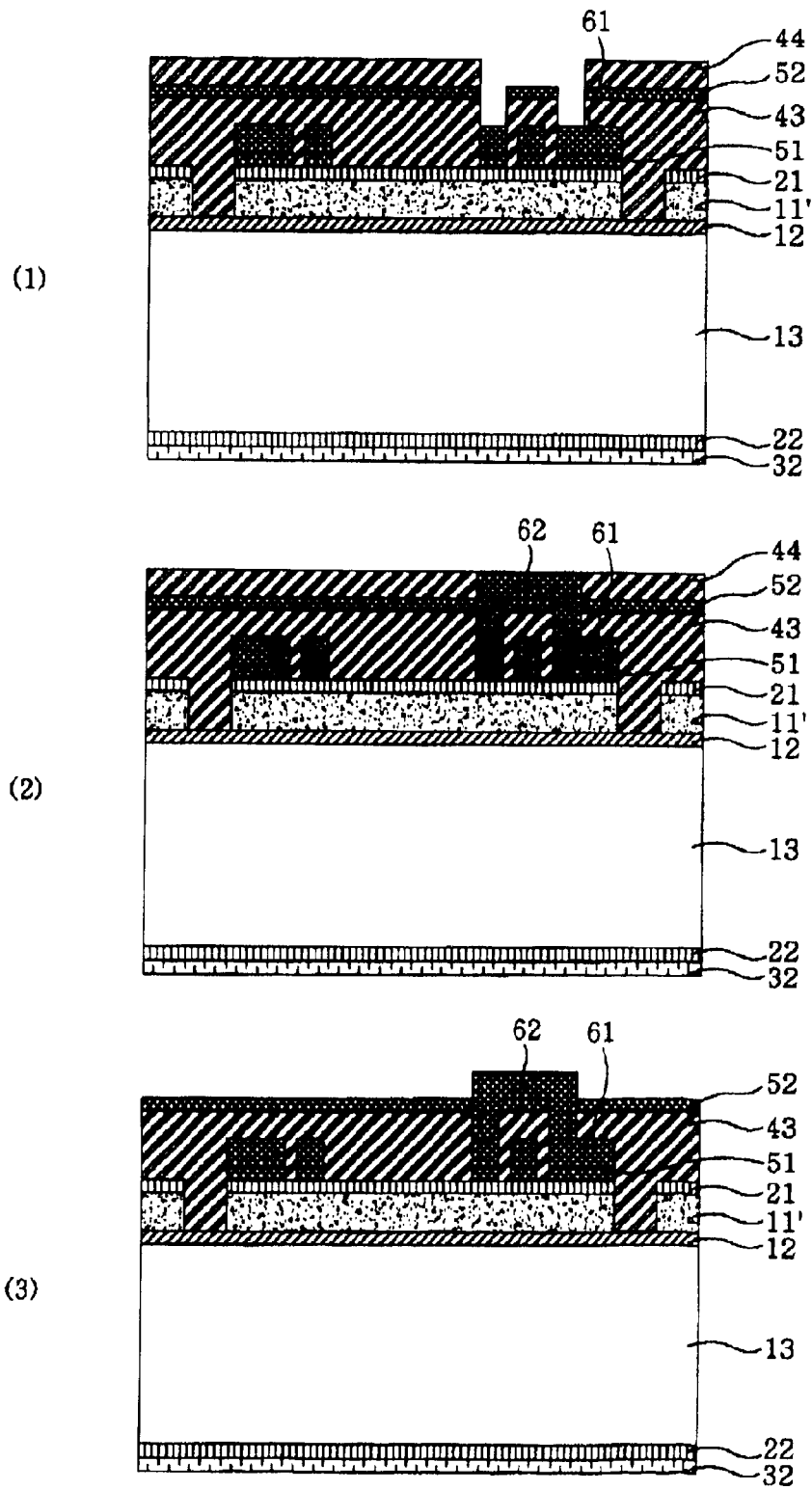

Next, the photoresist film 44 is patterned by a photolithography process to form a post mold ((1) of FIG. 2F) Post and bridge are concurrently formed by an electrolytic plating process using the patterned photoresist mold, thereby forming an upper metal interconnection line connected by the bridge ((2) of FIG. 2F).

Figure 2G:
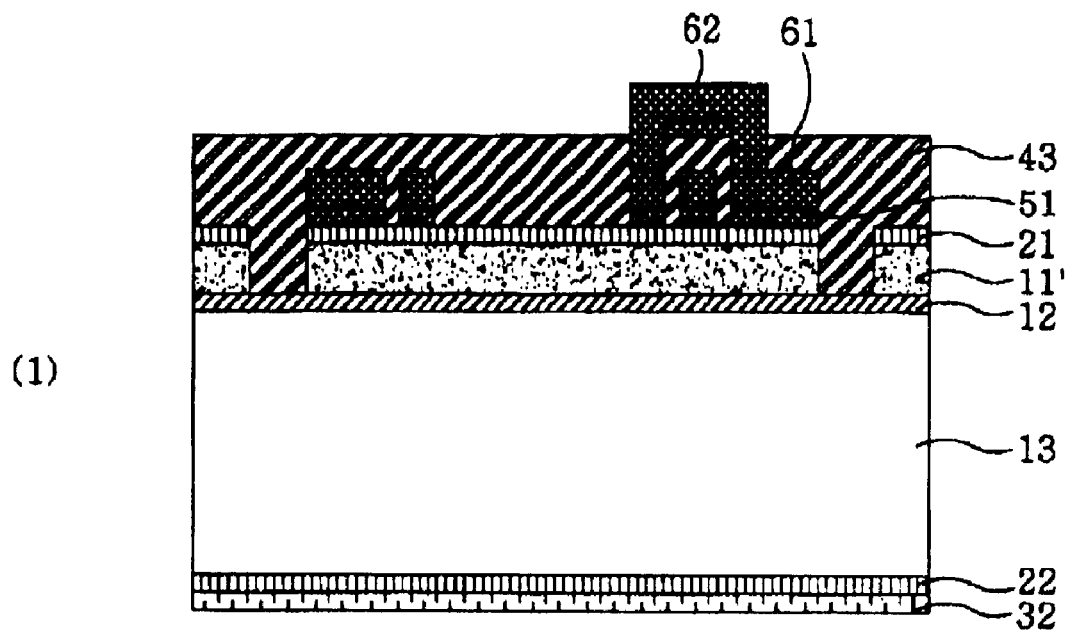
Figure 2G:
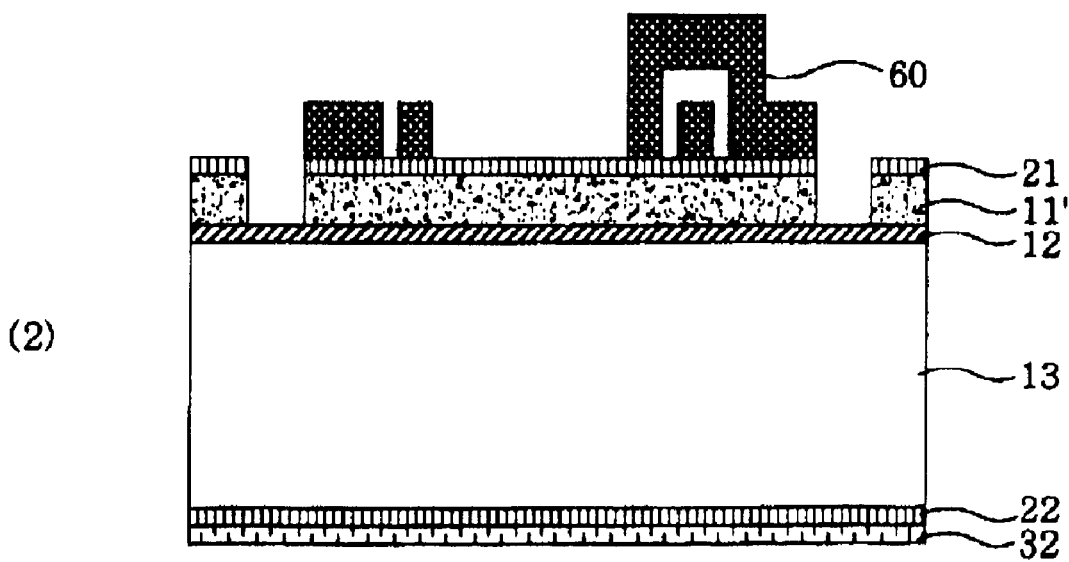

Referring to FIG. 2G, exposed portions of the molds 43, 44 and the upper metal film 52 which were used to form the post and bridge are removed. At this time, in case the mold is removed by a wet etch using acetone; the removal of the mold may cause a physical strong impact on the bridge while the photoresist film which was used as the mold for the post is removed. To this end, the photoresist mold which was used to form the bridge is removed by illuminating light and then the mold which was used to form the post is removed by using acetone. As a result, a single metal interconnection line with the bridge is formed.

Figure 2H:
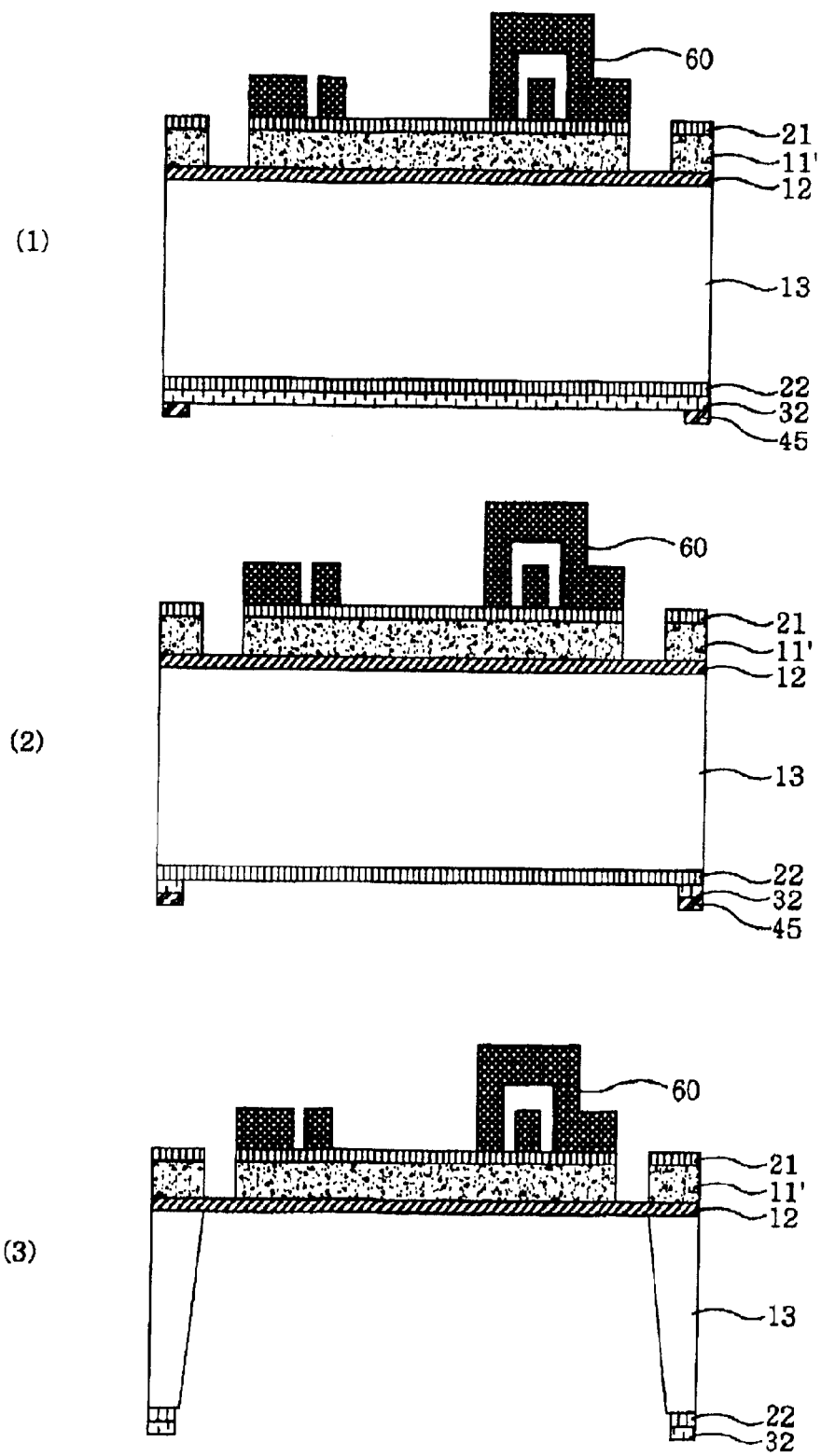
Figure 2I:
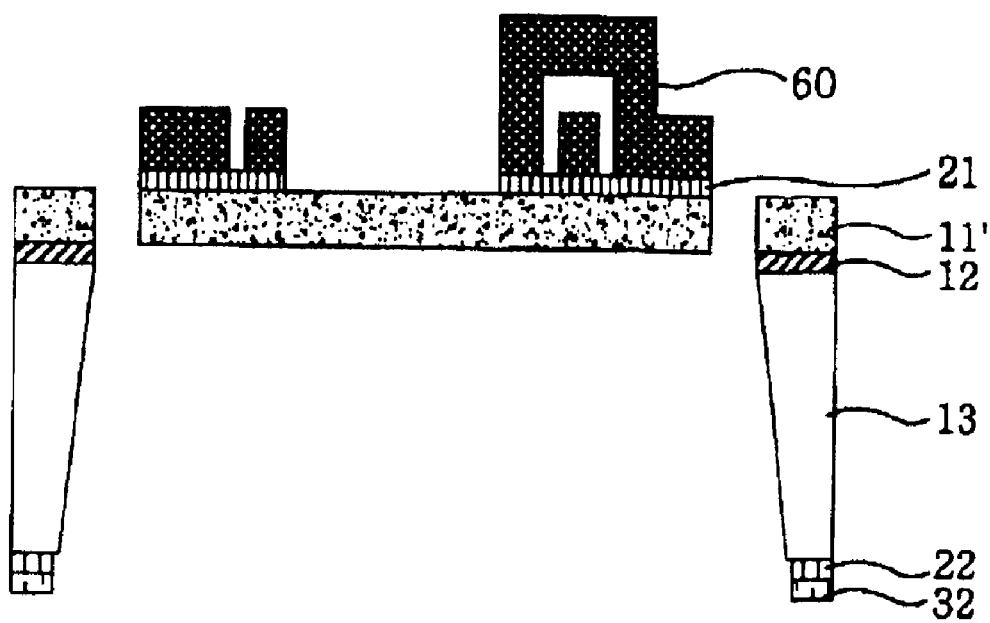

Next, there is described the step of etching the lower silicon layer and removing the oxide layer such that the silicon structure maintains a predetermined thickness with reference to FIGS. 2H and 2I.

First, referring to FIG. 2H, a photoresist film 44 is coated beneath the lower silicon nitride film 32 so as to remove the lower silicon layer 13 of the SOI substrate and is patterned by a photolithography process so as to leave a region intended to etch silicon. As a result of the photolithography process, a silicon nitride film pattern 45 for the etch of the lower silicon layer is formed ((1) of FIG. 2H). Afterwards, predetermined regions of the lower silicon nitride film 32 and the lower silicon oxide film 22 are removed ((2) of FIG. 2H). Thereafter, the lower silicon layer 13 of the SOI substrate is etched by a wet etch using an etch solution of KOH, TMAB or the like and using the lower silicon nitride film 32 as an etch mask ((3) of FIG. 2H). At this time, the oxide layer 12 of the SOI substrate is used as an etch stopper.

Next, referring to FIG. 2I, the oxide layer 12 which was used as the etch stopper is removed, so that a silicon structure viewed as the micromirror in the air can be obtained.

As described previously, since the micromirror actuator of the present invention can be actuated around two axes by electromagnetic force generated by electromagnetic field applied from outside, it is possible to obtain large force and large rotational angle. In addition, the micromirror actuator has a mechanically robust structure endurable against external impact, and is operable at a low voltage of 5V or less.

Further, it is possible to obtain a flat mirror surface sine the upper silicon layer of the SOI substrate is used as the mirror surface.

While the present invention has been described in detail, it should be understood that various changes, substitutions and alterations could be made hereto without departing from the spirit and scope of the invention as defined by the appended claims.

What is claimed is:

1. A micromirror actuator comprising:
    a substrate having a first penetration hole penetrating the substrate;
    a frame having a second penetration hole penetrating the frame, disposed inside the first penetration hole of the substrate, and connected with the substrate by first and second torsion bars formed to be bilateral symmetric around the frame;
    a micromirror disposed inside the second hole of the frame and connected with the frame by third and fourth torsion bars formed to be back and forth symmetric around the micromirror;
    first and second interdigitated cantilevers located between the substrate and the frame and protrudely formed from an inner wall of the first penetration hole to inside of the second penetration hole to be bilateral symmetric;
    third and fourth interdigitated cantilevers located between the substrate and the frame, protrudely formed from an inner wall, of the first penetration hole to inside of the second penetration hole to be back and forth symmetric to the first and second interdigitated cantilevers;
    first and second interconnection lines respectively formed on the first and second interdigitated cantilevers and connected with each other, third and fourth interconnection lines respectively formed on the third and fourth interconnection lines to be connected with each other and having a current flow direction opposite to a current flow direction flowing through the first and second interconnection lines, and fifth and sixth interconnection lines that are bilateral symmetric to an imaginary line connecting the third torsion bar and the fourth torsion bar and respectively formed on the micromirror such that currents having opposite directions flow;
    first to fourth connecting bars connecting the first to fourth interdigitated cantilevers with the frame respectively; and first and second magnets respectively installed outside the substrate to be bilateral symmetric to the substrate and having different polarities from each other.

2. The micromirror actuator of claim 1, wherein the substrate, the micromirror, the first to fourth interdigitated cantilevers, the first to fourth torsion bars, and the first to fourth connecting bars are made of single silicon.

3. The micromirror actuator of claim 2, wherein the micromirror further comprises a thin metal film formed thereon.

4. The micromirror actuator of claim 1, wherein the micromirror is rotated around the first and second torsion bars when current is applied to the first to fourth interconnection lines.

5. The micromirror actuator of claim 1, wherein the micromirror is rotated around the third and fourth torsion bars when current is applied to the fifth and sixth interconnection lines.

6. A method for fabricating the micromirror actuator according to claim 1, the method comprising the steps of:

(a) preparing an SOI substrate including an upper silicon layer, an oxide layer and a lower silicon layer;

(b) etching the upper silicon layer to form the frame, the first to fourth torsion bars, the first to fourth interdigitated cantilevers, and the first to fourth connecting bars;

(c) plating an interconnection line on the first to fourth interdigitated cantilevers and the micromirror; and (d) etching the lower silicon layer and removing the oxide layer such that the frame, the micromirror, the first to fourth torsion bars, the first to fourth interdigitated cantilevers, and the first to fourth connecting bars maintain only a predetermined thickness.

7. The method of claim 6, wherein the step (b) comprises the steps of:

oxidizing upper surface of the upper silicon layer and lower surface of the lower silicon layer to form an upper silicon oxide film and a lower silicon oxide film respectively;

respectively forming upper and lower silicon nitride films on the lower surface of the lower silicon oxide film;

coating a photoresist film on the exposed upper silicon oxide film, patterning and developing regions where the frame, the micromirror, the first to fourth torsion bars, the first to fourth interdigitated cantilevers, and the first to fourth connecting bars are intended to form a photoresist mask, and etching the upper silicon oxide film to form a silicon oxide mask intended to etch the upper silicon layer; and etching the upper silicon layer to form the frame, the micromirror, the first to fourth torsion bars, the first to fourth interdigitated cantilevers, and the first to fourth connecting bars.

8. The method of claim 6, wherein the step (c) comprises the steps of:

etching the upper silicon layer and depositing a lower metal film on the resultant substrate;

coating a photoresist film on the lower metal film and patterning a region of the photoresist film intended to form a lower metal interconnection line by using a photolithography method to form a lower plating mold;

forming a lower metal layer on a predetermined region on the exposed lower metal film by an electrolytic plating using the lower plating mold;

removing the lower metal film;

coating and patterning a photoresist film on the lower metal layer to form a post-frame for connecting an upper metal layer to be formed on the lower metal layer with the lower metal layer;

depositing an upper metal film on the post-frame;

coating a photoresist film on the upper metal film and patterning a region intended to form an upper metal interconnection line using a photolithography method to form an upper metal frame; and forming a post and the upper metal layer by an electrolytic plating process using the post-frame and the upper metal frame.

9. The method of claim 6, wherein the step (d) comprises the steps of:

coating a photoresist film beneath the lower silicon nitride film formed beneath the lower silicon oxide film and patterning a region intended to etch silicon by a photolithography method to form a mask for the etch of the lower silicon layer;

etching the lower silicon layer by using the patterned lower silicon nitride film as an etch mask and the oxide layer of the SOI substrate as an etch stopper; and removing the oxide layer.

10. The method of claim 7, wherein the step (c) comprises the steps of:

etching the upper silicon layer and depositing a lower metal film on the resultant substrate;

coating a photoresist film on the lower metal film and patterning a region of the photoresist film intended to form a lower metal interconnection line by using a photolithography method to form a lower plating mold;

forming a lower metal layer on a predetermined region on the exposed lower metal film by an electrolytic plating using the lower plating mold;

removing the lower metal film;

coating and patterning a photoresist film on the lower metal layer to form a post-frame for connecting an upper metal layer to be formed on the lower metal layer with the lower metal layer;

depositing an upper metal film on the post-frame;

coating a photoresist film on the upper metal film and patterning a region intended to form an upper metal interconnection line using a photolithography method to form an upper metal frame; and forming a post and the upper metal layer by an electrolytic plating process using the post-frame and the upper metal frame.

11. The method of claim 7, wherein the step (d) comprises the steps of:

coating a photoresist film beneath the lower silicon nitride film formed beneath the lower silicon oxide film and patterning a region intended to etch silicon by a photolithography method to form a mask for the etch of the lower silicon layer;

etching the lower silicon layer by using the patterned lower silicon nitride film as an etch mask and the oxide layer of the SOI substrate as an etch stopper; and removing the oxide layer.

* * * * *